(12) United States Patent
Kuroda et al.

(10) Patent No.: US 9,646,767 B2
(45) Date of Patent: May 9, 2017

(54) CERAMIC ELECTRONIC COMPONENT AND CERAMIC ELECTRONIC APPARATUS INCLUDING A SPLIT INNER ELECTRODE

(71) Applicant: Murata Manufacturing Co., Ltd., Nagaokakyo-shi, Kyoto-fu (JP)

(72) Inventors: Yoichi Kuroda, Nagaokakyo (JP); Masaaki Taniguchi, Nagaokakyo (JP); Yoshio Kawaguchi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/925,946

(22) Filed: Jun. 25, 2013

(65) Prior Publication Data

US 2013/0341082 A1    Dec. 26, 2013

Related U.S. Application Data

(63) Continuation of application No. 13/923,438, filed on Jun. 21, 2013.

(30) Foreign Application Priority Data

Jun. 22, 2012 (JP) .................................. 2012-141243
Mar. 28, 2013 (JP) .................................. 2013-069132

(51) Int. Cl.
*H01G 4/30*        (2006.01)
*H01G 4/012*       (2006.01)
(Continued)

(52) U.S. Cl.
CPC ............... *H01G 4/30* (2013.01); *H01C 7/008* (2013.01); *H01C 7/18* (2013.01); *H01F 17/0013* (2013.01);
(Continued)

(58) Field of Classification Search
CPC ............ H01G 4/30; H01G 4/012; H01G 4/12
(Continued)

(56) References Cited

U.S. PATENT DOCUMENTS 4,556,929 A * 12/1985 Tanaka et al. ............. 361/321.2
4,568,999 A *  2/1986 Larowe ..................... 361/306.3
(Continued)

FOREIGN PATENT DOCUMENTS

JP      64-035905 U        3/1989
JP      04302118 A   * 10/1992
(Continued)

OTHER PUBLICATIONS

Taniguchi et al., "Multilayer Ceramic Electronic Component and Manufacturing Method Thereof", U.S. Appl. No. 12/485,360, filed Jun. 16, 2009.
(Continued)

*Primary Examiner* — David M Sinclair
(74) *Attorney, Agent, or Firm* — Keating & Bennett, LLP

(57) ABSTRACT

A ceramic electronic component includes a ceramic element, a first inner electrode, a second inner electrode, an outer electrode, and a first auxiliary electrode. The first auxiliary electrode extends to a first surface of the ceramic element. The first inner electrode extends along a first direction on the first surface. The first auxiliary electrode extends outward from the region where the first inner electrode is disposed in the first direction on the first surface. The outer electrode covers the first inner electrode and the first auxiliary electrode.

4 Claims, 21 Drawing Sheets

(51) Int. Cl.
*H01C 7/00* (2006.01)
*H01C 7/18* (2006.01)
*H01F 17/00* (2006.01)
*H01F 27/02* (2006.01)
*H01G 4/12* (2006.01)
*H01L 41/04* (2006.01)
*H01L 41/047* (2006.01)
*H05K 7/00* (2006.01)

(52) U.S. Cl.
CPC .......... *H01F 27/022* (2013.01); *H01G 4/012* (2013.01); *H01G 4/12* (2013.01); *H01L 41/04* (2013.01); *H01L 41/0471* (2013.01); *H05K 7/00* (2013.01)

(58) Field of Classification Search
USPC .................................. 361/303, 301.4, 321.2
See application file for complete search history.

(56) References Cited

U.S. PATENT DOCUMENTS

| | | | |
|---|---|---|---|
| 5,978,204 A * | 11/1999 | Stevenson | 361/303 |
| 6,917,509 B1 * | 7/2005 | Devoe et al. | 361/309 |
| 6,960,366 B2 | 11/2005 | Ritter et al. | |
| 6,972,942 B2 | 12/2005 | Ritter et al. | |
| 6,982,863 B2 | 1/2006 | Galvagni et al. | |
| 7,067,172 B2 | 6/2006 | Ritter et al. | |
| 7,152,291 B2 | 12/2006 | Ritter et al. | |
| 7,154,374 B2 | 12/2006 | Ritter et al. | |
| 7,161,794 B2 | 1/2007 | Galvagni et al. | |
| 7,177,137 B2 | 2/2007 | Ritter et al. | |
| 7,230,815 B2 * | 6/2007 | Yoon et al. | 361/303 |
| 7,307,829 B1 * | 12/2007 | Devoe et al. | 361/328 |
| 7,344,981 B2 | 3/2008 | Ritter et al. | |
| 7,345,868 B2 | 3/2008 | Trinh | |
| 7,394,646 B2 * | 7/2008 | Tonogai | H01G 4/30 361/303 |
| 7,463,474 B2 | 12/2008 | Ritter et al. | |
| 7,688,567 B2 * | 3/2010 | Aoki | 361/306.3 |
| 8,315,033 B2 * | 11/2012 | Takashima et al. | 361/303 |
| 2005/0046536 A1 | 3/2005 | Ritter et al. | |
| 2007/0014075 A1 | 1/2007 | Ritter et al. | |
| 2007/0195484 A1 | 8/2007 | Bultitude et al. | |
| 2008/0123248 A1 | 5/2008 | Kunishi et al. | |
| 2008/0123249 A1 | 5/2008 | Kunishi et al. | |
| 2008/0158774 A1 | 7/2008 | Trinh | |
| 2009/0154055 A1 * | 6/2009 | Takashima | H01G 4/30 361/301.4 |
| 2009/0290280 A1 | 11/2009 | Takeuchi et al. | |
| 2011/0122540 A1 * | 5/2011 | Ogawa | H01G 4/2325 361/305 |
| 2011/0149466 A1 * | 6/2011 | Hwang et al. | 361/303 |
| 2011/0236658 A1 | 9/2011 | Motoki et al. | |
| 2011/0317327 A1 * | 12/2011 | Ahn et al. | 361/301.4 |
| 2012/0019981 A1 * | 1/2012 | Yoshida | H01C 1/1406 361/321.1 |
| 2012/0314338 A1 * | 12/2012 | Togashi | 361/306.3 |
| 2013/0020905 A1 * | 1/2013 | Sawada | H01G 4/30 310/311 |

FOREIGN PATENT DOCUMENTS

| | | | |
|---|---|---|---|
| JP | 08279437 A | * | 10/1996 |
| JP | 09129476 A | * | 5/1997 |
| JP | 10-022160 A | | 1/1998 |
| JP | 2000-012377 A | | 1/2000 |
| JP | 2005216955 A | * | 8/2005 |
| JP | 2008-091400 A | | 4/2008 |
| JP | 2009-527919 A | | 7/2009 |
| JP | 2009-283597 A | | 12/2009 |
| JP | 2011-204706 A | | 10/2011 |
| JP | 2012253245 A | * | 12/2012 |
| WO | 2007/049456 A1 | | 5/2007 |

OTHER PUBLICATIONS

Yoshida et al., "Monolithic Ceramic Electronic Component", U.S. Appl. No. 12/494,537, filed Jun. 30, 2009.
Iwanaga et al., "Laminated Ceramic Electronic Component and Manufacturing Method Therefor", U.S. Appl. No. 13/189,636, filed Jul. 25, 2011.
Sasaki, "Electronic Component", U.S. Appl. No. 13/187,678, filed Jul. 21, 2011.
Akazawa et al., "Multilayer Ceramic Electronic Component", U.S. Appl. No. 13/357,677, filed Jan. 25, 2012.
Taniguchi et al., "Multilayer Ceramic Electronic Component and Manufacturing Method Thereof", U.S. Appl. No. 13/484,300, filed May 31, 2012.
Akazawa et al., "Laminated Ceramic Electronic Component", U.S. Appl. No. 13/494,042, filed Jun. 12, 2012.
Sakuratani, "Monolithic Ceramic Electronic Component", U.S. Appl. No. 13/517,624, filed Jul. 14, 2012.
Sakuratani, "Monolithic Ceramic Electronic Component", U.S. Appl. No. 13/517,625, filed Jul. 14, 2012.
Sakuratani, "Monolithic Ceramic Electronic Component", U.S. Appl. No. 13/561,285, filed Jul. 30, 2012.
Kuroda et al., "Ceramic Electronic Component and Ceramic Electronic Apparatus", U.S. Appl. No. 13/923,438, filed Jun. 21, 2013.
Official Communication issued in corresponding Japanese Patent Application No. 2013-069132, mailed on Aug. 30, 2016.

* cited by examiner

CERAMIC ELECTRONIC COMPONENT AND CERAMIC ELECTRONIC APPARATUS INCLUDING A SPLIT INNER ELECTRODE

BACKGROUND OF THE INVENTION

1. Field of the Invention

The present invention relates to a ceramic electronic component and a ceramic electronic apparatus.

2. Description of the Related Art

Traditionally, components, including an integrated circuit (IC) chip and a ceramic electronic component, may be mounted on a substrate. The IC chip may be adversely affected by a flux contained in soldering. To address this issue, the IC chip and the ceramic electronic component may be electrically connected to each other by wire bonding. For example, Japanese Unexamined Utility Model Registration Application Publication No. 5-4451 discloses a stacked capacitor electrically connected to an IC chip by wire bonding.

In recent years, miniaturization of ceramic electronic components has made it difficult to precisely form outer electrodes for use in connecting wires to the ceramic electronic components. One example of a method of precisely forming an outer electrode is a method of forming the outer electrode directly by plating, as disclosed in Japanese Unexamined Patent Application Publication No. 2004-327983.

However, when an outer electrode is formed directly by plating, moisture tends to enter the inside of the ceramic electronic component from between the outer electrode and the ceramic element or other areas. This causes a problem in that the resistance to moisture in the ceramic electronic component is reduced.

SUMMARY OF THE INVENTION

Preferred embodiments of the present invention provide a ceramic electronic component with a high moisture resistance.

According to a preferred embodiment of the present invention, a ceramic electronic component includes a ceramic element, at least one first inner electrode, a second inner electrode, an outer electrode, and a first auxiliary electrode. The ceramic element preferably has a rectangular or substantially rectangular parallelepiped shape. The at least one first inner electrode is disposed inside the ceramic element. The first inner electrode extends to a first surface of the ceramic element. The second inner electrode is disposed inside the ceramic element. The second inner electrode faces the at least one first inner electrode. The second inner electrode extends to an opposite surface of the ceramic element, the opposite surface being opposed to the first surface. The outer electrode is arranged on the first surface of the ceramic element. The outer electrode is connected to the at least one first inner electrode. The outer electrode is defined by a plated film. The first auxiliary electrode is disposed inside the ceramic element. The first auxiliary electrode extends to the first surface of the ceramic element. The at least one first inner electrode extends along a first direction on the first surface. The first auxiliary electrode extends outward from a region where the at least one first inner electrode is disposed in the first direction on the first surface. The outer electrode covers the at least one first inner electrode and the first auxiliary electrode.

In a specific aspect of the ceramic electronic component according to a preferred embodiment of the present invention, the at least one first inner electrode may include a plurality of first inner electrodes extending along a second direction perpendicular or substantially perpendicular to the first direction, and the first auxiliary electrode may be positioned between the plurality of first inner electrodes.

In another specific aspect of the ceramic electronic component according to a preferred embodiment of the present invention, the first auxiliary electrode may be positioned between the first inner electrode nearest to a second surface of the ceramic element and the second surface, the second surface being parallel or substantially parallel to the first inner electrode.

In yet another specific aspect of the ceramic electronic component according to a preferred embodiment of the present invention, the length of the first inner electrode in the first direction on the first surface may be shorter than the length of the first inner electrode in the first direction in a portion that is the most distant from the first surface inside the ceramic element.

In still another specific aspect of the ceramic electronic component according to a preferred embodiment of the present invention, the first surface may be a principal surface.

In another specific aspect of the ceramic electronic component according to a preferred embodiment of the present invention, the ceramic electronic component may further include a second auxiliary electrode disposed inside the ceramic element and extending to the opposite surface of the ceramic element. The first auxiliary electrode may be positioned outside the second auxiliary electrode in the second direction that is perpendicular or substantially perpendicular to the first direction.

In yet another aspect of the ceramic electronic component according to a preferred embodiment of the present invention, the ceramic electronic component may further include a third inner electrode disposed inside the ceramic element and not extending to the surfaces of the ceramic element.

According to another preferred embodiment of the present invention, a ceramic electronic apparatus includes the above-described ceramic electronic component, a substrate, and wire. The substrate is arranged such that a principal surface of the substrate faces the opposite surface in the ceramic electronic component. The wire is electrically connected to the outer electrode.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
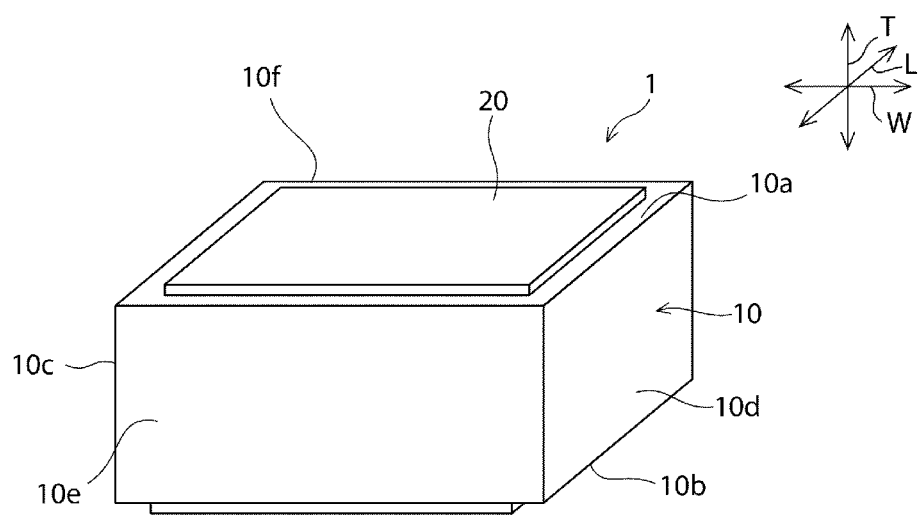
FIG. 1 is a schematic perspective view of a ceramic electronic component according to a first preferred embodiment of the present invention.

Preferred embodiments of the present invention will be further described below. The preferred embodiments below are merely illustrative. The present invention is not limited to the preferred embodiments described below.

Members having substantially the same functions are referred to using the same reference numerals in the drawings referred to in the description of the preferred embodiments of the present invention. The drawings referred to in the description of the preferred embodiments of the present invention are schematically illustrated, and the ratios of the dimensions of elements in the drawings may be different from those of actual elements. The ratios of the dimensions of objects may be different among the drawings. Specific ratios of the dimensions of elements should be construed in consideration of the description below.

First Preferred Embodiment

Figure 2:
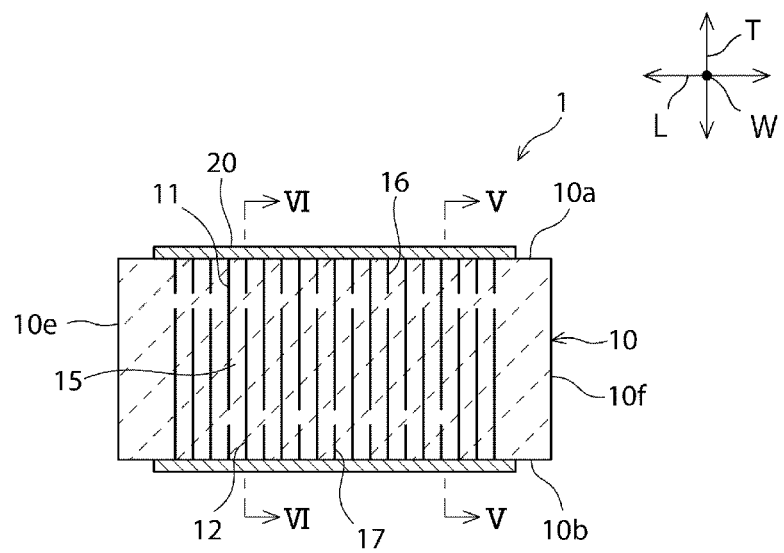
FIG. 2 is a schematic cross-sectional view of the ceramic electronic component according to the first preferred embodiment of the present invention.
Figure 3:
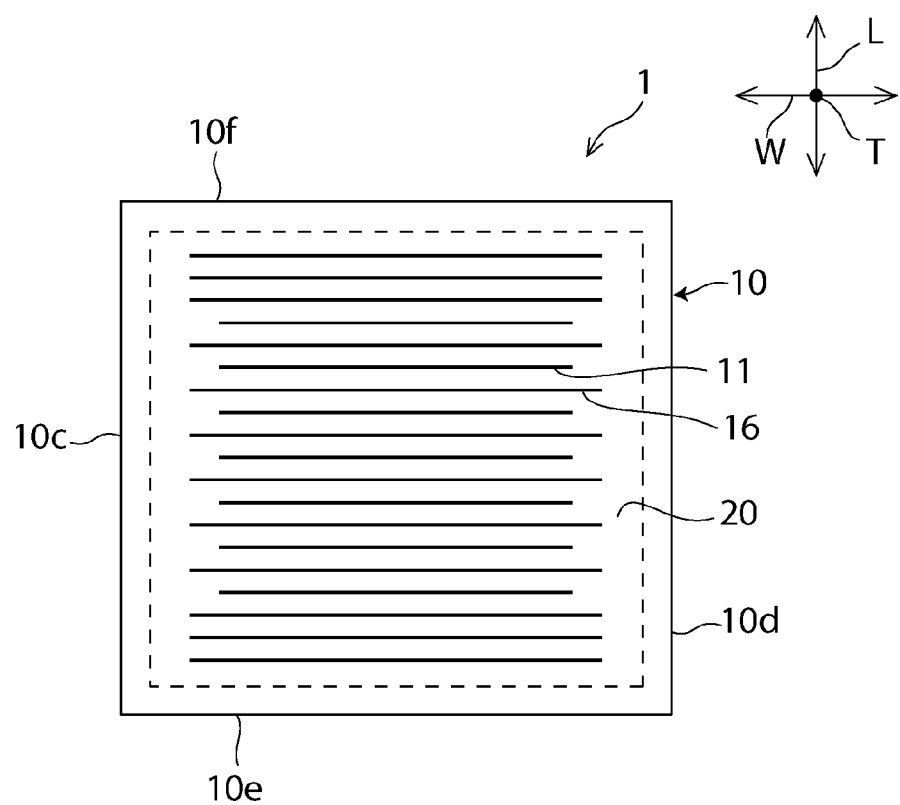
FIG. 3 is a schematic plan view of the ceramic electronic component according to the first preferred embodiment of the present invention.
Figure 4:
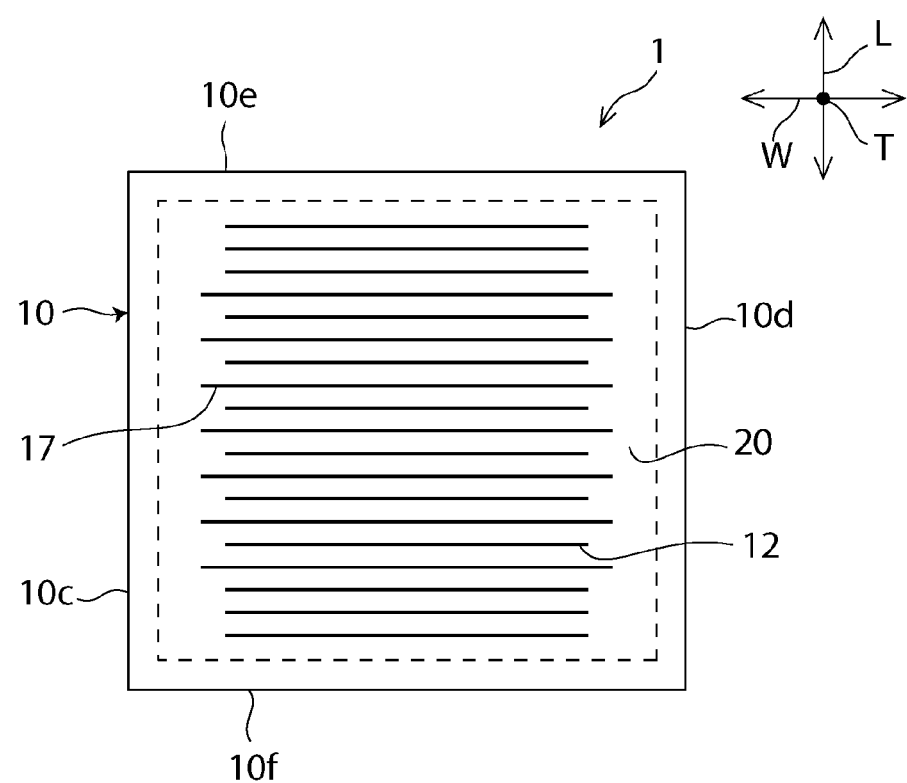
FIG. 4 is a schematic back-side view of the ceramic electronic component according to the first preferred embodiment of the present invention.
Figure 5:
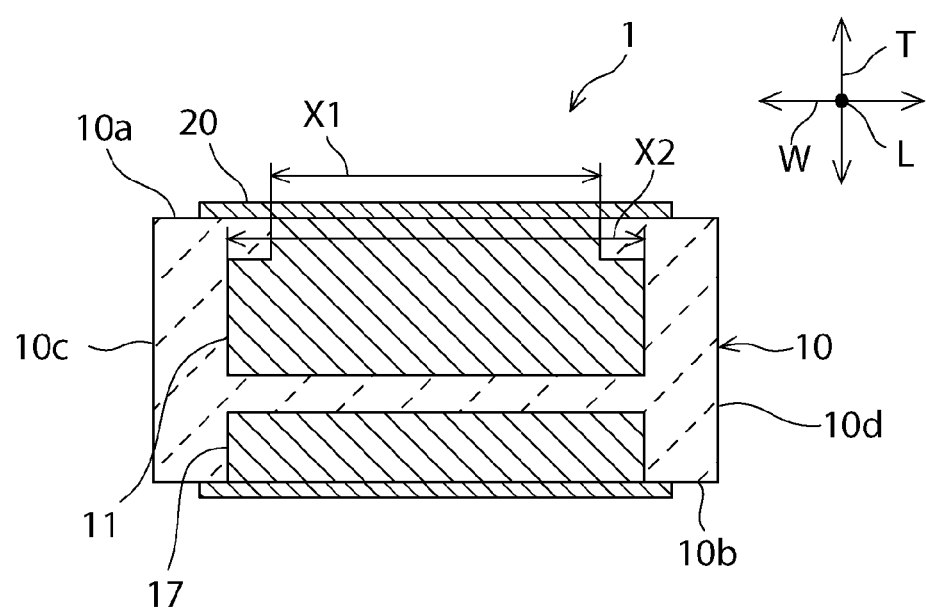
FIG. 5 is a schematic cross-sectional view taken along the line V-V in FIG. 2.
Figure 6:
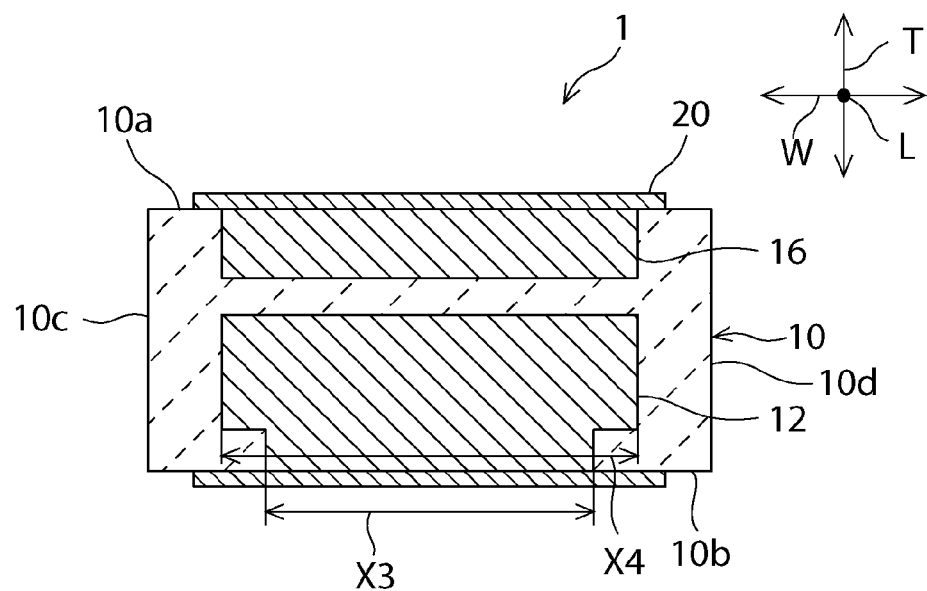
FIG. 6 is a schematic cross-sectional view taken along the line VI-VI in FIG. 2.

FIG. 1 is a schematic perspective view of a ceramic electronic component according to a first preferred embodiment of the present invention. FIG. 2 is a schematic cross-sectional view of the ceramic electronic component according to the first preferred embodiment. FIG. 3 is a schematic plan view of the ceramic electronic component according to the first preferred embodiment. FIG. 4 is a schematic back-side view of the ceramic electronic component according to the first preferred embodiment. FIG. 5 is a schematic cross-sectional view taken along the line V-V in FIG. 2. FIG. 6 is a schematic cross-sectional view taken along the line VI-VI in FIG. 2.

As illustrated in FIGS. 1 to 6, a ceramic electronic component 1 includes a ceramic element 10. The ceramic element 10 preferably has the shape of a rectangular or substantially rectangular parallelepiped. The ceramic element 10 includes first and second principal surfaces 10a and 10b facing each other, first and second side surfaces 10c and 10d facing each other, and first and second end surfaces 10e and 10f facing each other. Each of the first and second principal surfaces 10a and 10b extends along the length direction L and width direction W. Each of the first and second side surfaces 10c and 10d extends along the length direction L and thickness direction T. Each of the first and second end surfaces 10e and 10f extends along the width direction W and thickness direction T. The length direction L and width direction W are perpendicular or substantially perpendicular to each other. The thickness direction T is perpendicular or substantially perpendicular to each of the length direction L and width direction W.

The dimension in the length direction L and the dimension in the width direction W in the ceramic element 10 are the same or substantially the same.

In the present invention, a "substantially rectangular parallelepiped" contains a substantially rectangular parallelepiped including a rounded corner or ridge. That is, the ceramic element 10 may have the shape of a substantially rectangular parallelepiped whose corners and ridges are rounded at least in part.

As illustrated in FIG. 2, the ceramic element 10 is a laminated member in which a plurality of ceramic portions (ceramic layers) 15 are stacked along the length direction L. The thickness of each of the ceramic portions 15 may preferably be about 0.5 μm to about 10 μm, for example.

The ceramic element 10 is made of any suitable ceramic material. The ceramic material of the ceramic element 10 is suitably selected depending on the characteristics of the ceramic electronic component 1.

As an example, when the ceramic electronic component 1 is a ceramic capacitor device, the ceramic element 10 can be made of a material whose chief ingredient is a dielectric ceramic. Specific examples of the dielectric ceramic can include barium titanate ($BaTiO_3$), calcium titanate ($CaTiO_3$), strontium titanate ($SrTiO_3$), and calcium zirconate ($CaZrO_3$). An accessory ingredient, such as a manganese compound, a magnesium compound, a silicon compound, a cobalt compound, a nickel compound, or a rare-earth compound, may also be suitably added to the ceramic element 10.

As another example, when the ceramic electronic component 1 is a ceramic piezoelectric device, the ceramic element 10 can be made of a material whose chief ingredient is a piezoelectric ceramic. Specific examples of the piezoelectric ceramic can include a PZT-based ceramic.

As yet another example, when the ceramic electronic component 1 is a thermistor device, the ceramic element 10 can be made of a semiconductor ceramic. Specific examples of the semiconductor ceramic can include a spinel-based ceramic.

As still another example, when the ceramic electronic component 1 is an inductor device, the ceramic element 10 can be made of a magnetic ceramic. Specific examples of the magnetic ceramic can include a ferrite ceramic.

In the present preferred embodiment, an example in which the ceramic electronic component 1 is a ceramic capacitor and the ceramic element 10 is made of a material whose chief ingredient is a dielectric ceramic is described below.

The ceramic electronic component 1 further includes a plurality of first inner electrodes 11 and a plurality of second inner electrodes 12 disposed inside the ceramic element 10. Each of the first and second inner electrodes 11 and 12 extends along the thickness direction T and width direction W inside the ceramic element 10. The plurality of first and second inner electrodes 11 and 12 are arranged along the length direction L. The first and second inner electrodes 11 and 12 are alternately arranged along the length direction L. The first and second inner electrodes 11 and 12 face each other in the length direction L such that the ceramic portion 15 is disposed therebetween. In the present invention, the first and second inner electrodes 11 and 12 are not necessarily required to face each other such that the ceramic portion 15 is disposed therebetween.

The first inner electrodes 11 extend to the first principal surface 10a. The first inner electrodes 11 extend along the width direction W in the first principal surface 10a. The first inner electrodes 11 are exposed to none of the second principal surface 10b, which is the opposite surface positioned on the opposite side of the first principal surface 10a, the first and second side surfaces 10c and 10d, and the first and second end surfaces 10e and 10f.

In the present preferred embodiment, as illustrated in FIG. 5, the length X1 of each of the first inner electrodes 11 along the width direction W in the first principal surface 10a is shorter than the length X2 of the first inner electrode 11 along the width direction W in the most distant portion from the first principal surface 10a inside the ceramic element 10. The present invention is not limited to this preferred embodiment. In the present invention, the length of the first inner electrode 11 along the width direction W in the first principal surface 10a may be the same as or may be longer than the length of the first inner electrode 11 along the width direction W inside the ceramic element 10. From the viewpoint of increasing the area where the first and second inner electrodes 11 and 12 face each other and ensuring the capacity, the length of the first inner electrode 11 along the width direction W inside the ceramic element 10 may preferably be longer than the length of the first inner electrode 11 along the width direction W in the first principal surface 10a.

The second inner electrodes 12 extend to the second principal surface 10b. The second inner electrodes 12 extend along the width direction W in the second principal surface 10b. The second inner electrodes 12 are exposed to none of the first principal surface 10a, the first and second side surfaces 10c and 10d, and the first and second end surfaces 10e and 10f.

In the present preferred embodiment, as illustrated in FIG. 6, the length X3 of each of the second inner electrodes 12 along the width direction W in the second principal surface 10b is shorter than the length X4 of the second inner electrode 12 along the width direction W inside the ceramic element 10. The present invention is not limited to this preferred embodiment. In the present invention, the length of the second inner electrode 12 along the width direction W in the second principal surface 10b may be the same as or may be longer than the length of the second inner electrode 12 along the width direction W inside the ceramic element 10. From the viewpoint of increasing the area where the first and second inner electrodes 11 and 12 face each other and ensuring the capacity, the length of the second inner electrode 12 along the width direction W inside the ceramic element 10 may preferably be longer than the length of the second inner electrode 12 along the width direction W in the second principal surface 10b.

The thickness of each of the first and second inner electrodes 11 and 12 may preferably be about 0.3 µm to about 2.0 µm, for example.

The first and second inner electrodes 11 and 12 can be any conductive element and are not particularly limited. Each of the first and second inner electrodes 11 and 12 can be made of a metal, such as nickel, copper, silver, palladium, or gold, or an alloy that includes at least one of these metals, such as a silver-palladium alloy.

The ceramic electronic component 1 further includes rectangular or substantially rectangular first and second auxiliary electrodes 16 and 17 disposed inside the ceramic element 10. In the present invention, an "auxiliary electrode" is an electrode that does not virtually contribute to achieving the functions of the ceramic electronic component. Each of the first and second auxiliary electrodes 16 and 17 can be made of the same metal or alloy as that of each of the first and second inner electrodes.

As illustrated in FIG. 3, at least one of the plurality of first auxiliary electrodes 16 is positioned between the plurality of first inner electrodes 11. At least one of the plurality of first auxiliary electrodes 16 is positioned between the first inner electrode 11 nearest to the first end surface 10e, which is a surface of the ceramic element 10 that is parallel or substantially parallel to the first inner electrodes 11, and the first end surface 10e. At least one of the plurality of first auxiliary electrodes 16 is positioned between the first inner electrode 11 nearest to the second end surface 10f, which is a surface of the ceramic element 10 that is parallel or substantially parallel to the first inner electrodes 11, and the second end surface 10f.

The first auxiliary electrodes 16 extend to the first principal surface 10a. The first auxiliary electrodes 16 extend along the width direction W in the first principal surface 10a. The first auxiliary electrodes 16 are exposed to none of the second principal surface 10b, the first and second side surfaces 10c and 10d, and the first and second end surfaces 10e and 10f. The first auxiliary electrodes 16 extend outward from the region where the first inner electrodes 11 are disposed in the width direction W in the first principal surface 10a.

As illustrated in FIG. 4, at least one of the plurality of second auxiliary electrodes 17 is positioned between the plurality of second inner electrodes 12. At least one of the plurality of second auxiliary electrodes 17 is positioned between the second inner electrode 12 nearest to the first end surface 10e, which is a surface of the ceramic element 10 that is parallel or substantially parallel to the second inner electrodes 12, and the first end surface 10e. At least one of the plurality of second auxiliary electrodes 17 is positioned between the second inner electrode 12 nearest to the second end surface 10f, which is a surface of the ceramic element 10 that is parallel or substantially parallel to the second inner electrodes 12, and the second end surface 10f.

The second auxiliary electrodes 17 are exposed to none of the first principal surface 10a, the first and second side surfaces 10c and 10d, and the first and second end surfaces 10e and 10f. The second auxiliary electrodes 17 extend outward from the region where the second inner electrodes 12 are disposed in the width direction W in the second principal surface 10b. As illustrated in FIG. 3, the ceramic electronic component 1 includes first auxiliary electrodes positioned outside the second auxiliary electrodes 17 in the length direction L, which is perpendicular or substantially perpendicular to the width direction W.

An outer electrode 20 is arranged on each of the first and second principal surfaces 10a and 10b of the ceramic element 10. The outer electrode 20 on the first principal surface 10a is connected to the first inner electrodes 11. The outer electrode 20 on the second principal surface 10b is connected to the second inner electrodes 12. The outer electrode 20 on the first principal surface 10a covers the first inner electrodes 11 and the first auxiliary electrodes 16. The outer electrode 20 on the second principal surface 10b covers the second inner electrodes 12 and the second auxiliary electrodes 17.

The outer electrode 20 is preferably defined by at least one plated film. The outer electrode 20 may include a laminate of a plurality of plated films. The thickness of one plated film may preferably be about 1 μm to about 15 μm, for example.

The outer electrode 20 can be made of a metal, such as copper, nickel, tin, extend, gold, silver, palladium, bismuth, or zinc, or an alloy that includes at least one of these metals, for example. The outer electrode 20 may preferably include a three-layer structure of copper, nickel, and gold or a two-layer structure of nickel and gold, for example.

Next, one example of a method of manufacturing the ceramic electronic component 1 will be described.

First, a ceramic green sheet including a ceramic material for forming the ceramic element 10 is prepared. Then, a conductive pattern is formed on the ceramic green sheet by applying conductive paste.

Then, a plurality of ceramic green sheets with no conductive patterns, ceramic green sheets each including a conductive pattern of the shape corresponding to the first or second inner electrode 11 or 12 or the first or second auxiliary electrode 16 or 17, a plurality of ceramic green sheets with no conductive patterns are stacked in this order, and the laminate is pressed in the stacking direction, so as to produce the mother laminate.

Then, the mother laminate is cut along virtual cutting lines thereon, so as to produce a plurality of green ceramic laminates from the mother laminate.

Then, the green ceramic laminates are fired. In this firing process, the first and second inner electrodes 11 and 12 and the first and second auxiliary electrodes 16 and 17 are fired.

Then, the outer electrode 20, which will be formed from a plated film, is formed on each of the fired ceramic laminates by plating. In this way, the ceramic electronic component 1 can be manufactured.

In the ceramic electronic component 1, the first auxiliary electrodes 16 extend outward from the region where the first inner electrodes 11 are disposed in the width direction W in the first principal surface 10a. Accordingly, if plating solution used in forming a plated film or moisture in the atmosphere enters the surface of the outer electrode from between the ceramic element 10 and the outer electrode 20, the path along which the moisture will reach the first inner electrodes 11 can be extended. In other words, the moisture entering from between the edge of the outer electrode 20 and the ceramic element 10 tends to enter the first auxiliary electrodes 16 before reaching the first inner electrodes 11. Thus a decrease in insulation resistance does not easily occur in the first inner electrodes 11. Accordingly, the ceramic electronic component 1 is highly resistant to moisture.

In connecting wire to the outer electrode in the ceramic electronic component, the outer electrode may be separated from the ceramic element, depending on the force on the outer electrode during connecting the wire or after connecting the wire. For the ceramic electronic component 1, because the area of the region where the plated film forming the outer electrode 20 and the first auxiliary electrodes 16 are attached to each other is large, the adhesive strength of the outer electrode 20 to the ceramic element is high. Accordingly, when the wire is connected to the outer electrode 20 on the first principal surface 10a, the outer electrode 20 is not easily separated from the ceramic element 10.

One or more of the first auxiliary electrodes 16 are positioned between the first inner electrode 11 nearest to the first end surface 10e of the ceramic element 10 and the first end surface 10e in the ceramic electronic component 1. Thus, the adhesive strength between the outer electrode 20 and the ceramic element 10 at the end portion of the outer electrode 20 is higher. Another one or more of the first auxiliary electrodes 16 are positioned between the first inner electrode 11 nearest to the second end surface 10f of the ceramic element 10 and the second end surface 10f. Thus, the adhesive strength between the outer electrode 20 and the ceramic element 10 at the end portion of the outer electrode 20 is higher.

The area of the first auxiliary electrodes 16 is larger than that of the first inner electrodes 11 in the first principal surface 10a in the ceramic electronic component 1. Thus, the adhesive strength between the outer electrode 20 and the ceramic element 10 is further increased.

The first principal surface 10a, to which the first auxiliary electrodes 16 are exposed, is a principal surface whose area is larger than each of the first and second side surfaces 10c and 10d and the first and second end surfaces 10e and 10f. Thus, the area of the outer electrode 20 is large. In such a case, the advantageous effect achieved by an increase in adhesive strength between the ceramic element 10 and the outer electrode 20 is great.

Figure 7:
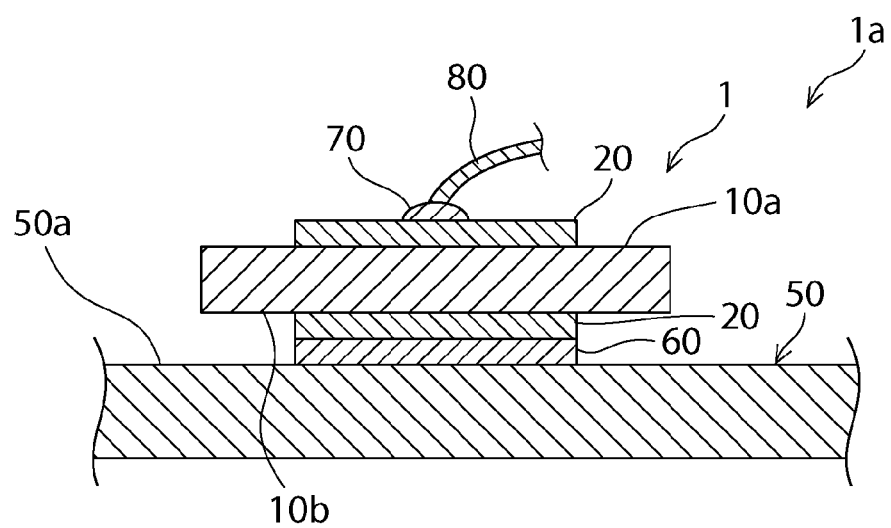
FIG. 7 is a schematic cross-sectional view of a ceramic electronic apparatus according to a preferred embodiment of the present invention.

The ceramic electronic component 1 can be used as a component in a ceramic electronic apparatus 1a illustrated in FIG. 7, for example. The ceramic electronic apparatus 1a includes the ceramic electronic component 1, a substrate 50, and wire 80. The ceramic electronic component 1 is arranged such that the second principal surface 10b faces a principal surface 50a of the substrate 50. The substrate 50 is provided with a land 60. The ceramic electronic component 1 is arranged such that the outer electrode 20 on the second principal surface 10b faces the land 60 with a curing agent 70 of conductive adhesive being disposed therebetween.

The wire 80 is electrically connected to the outer electrode 20 on the first principal surface 10a such that the curing agent 70 of conductive adhesive is disposed therebetween.

The ratio of the area of the first auxiliary electrodes 16 in the first principal surface 10a to that of the first inner electrodes 11 is larger than the ratio of the area of the second auxiliary electrodes 17 in the second principal surface 10b to that of the second inner electrodes 12 in the ceramic electronic component 1. Thus, for example, the area of the outer electrode 20 on the first principal surface 10a can be large, and the area of the outer electrode 20 on the second principal surface 10b can be small. If the area of the outer electrode 20 on the first principal surface 10a is large, it is easy to connect wire to the outer electrode 20 on the first principal surface 10a. If the area of the outer electrode 20 on the second principal surface 10b is small, a problem, such as a short circuit caused by the outer electrode 20 coming into contact with another electronic component, does not easily occur in arranging the outer electrode 20 directly above the land 60 on the substrate 50, as illustrated in FIG. 7.

Other examples of preferred embodiments of the present invention are described below. In the following description, members having substantially common functions as in the above first preferred embodiment are referred to using common reference numerals, and the description thereof is omitted.

Second Preferred Embodiment

Figure 8:
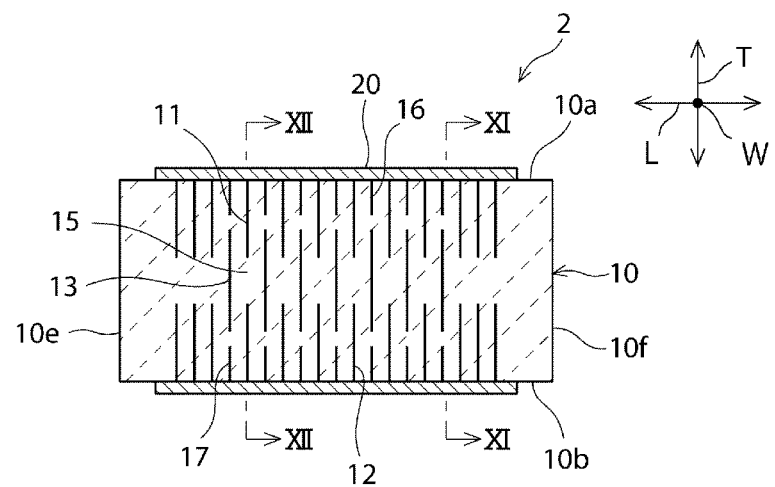
FIG. 8 is a schematic cross-sectional view of a ceramic electronic component according to a second preferred embodiment of the present invention.
Figure 9:
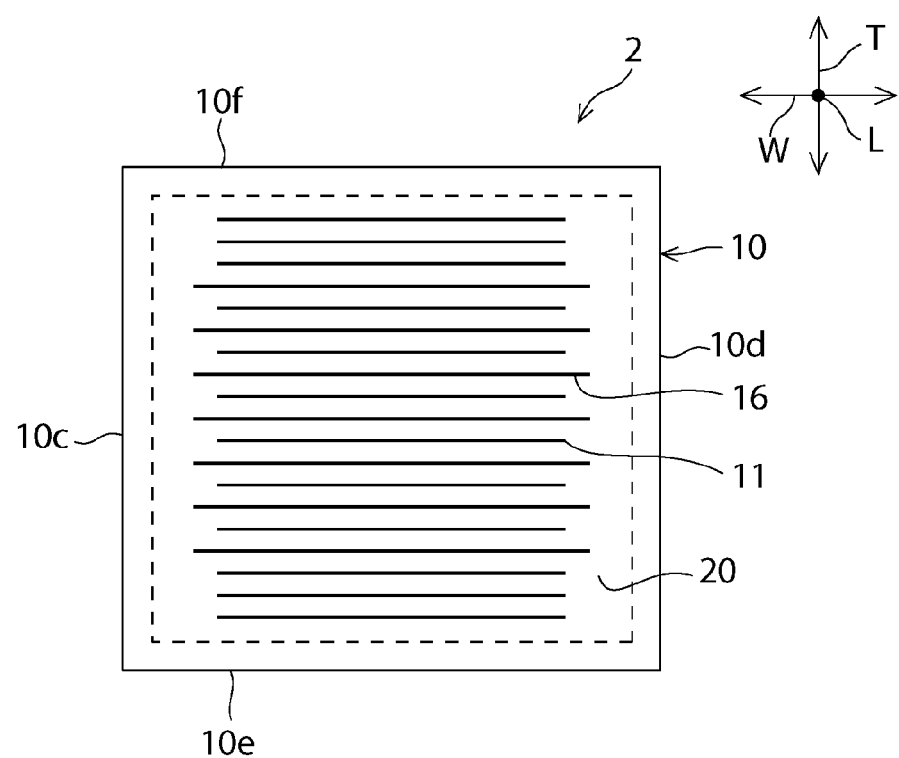
FIG. 9 is a schematic plan view of the ceramic electronic component according to the second preferred embodiment of the present invention.
Figure 10:
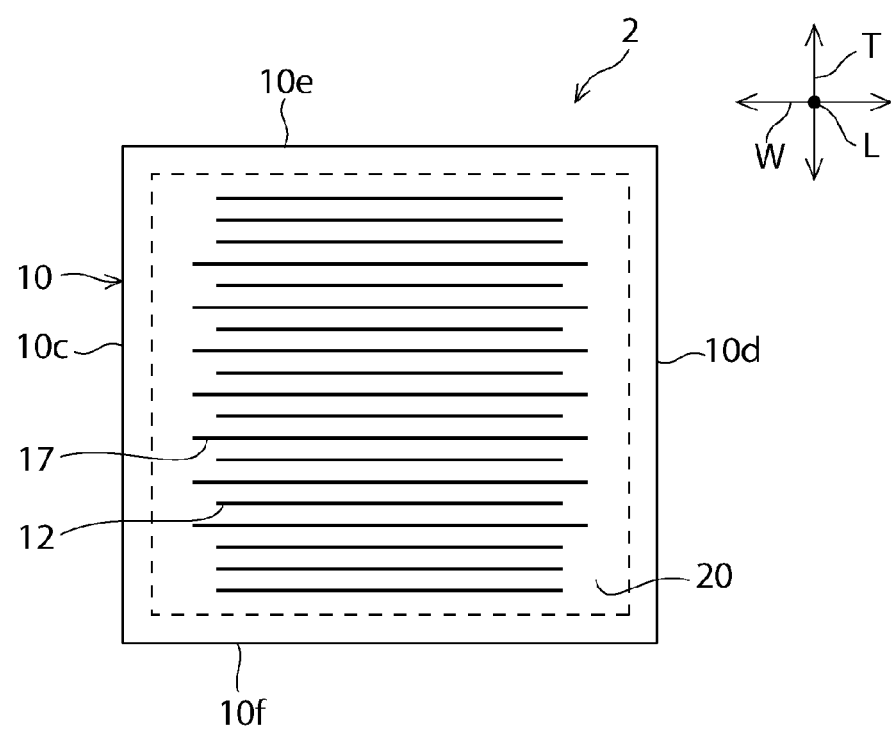
FIG. 10 is a schematic back-side view of the ceramic electronic component according to the second preferred embodiment of the present invention.
Figure 11:
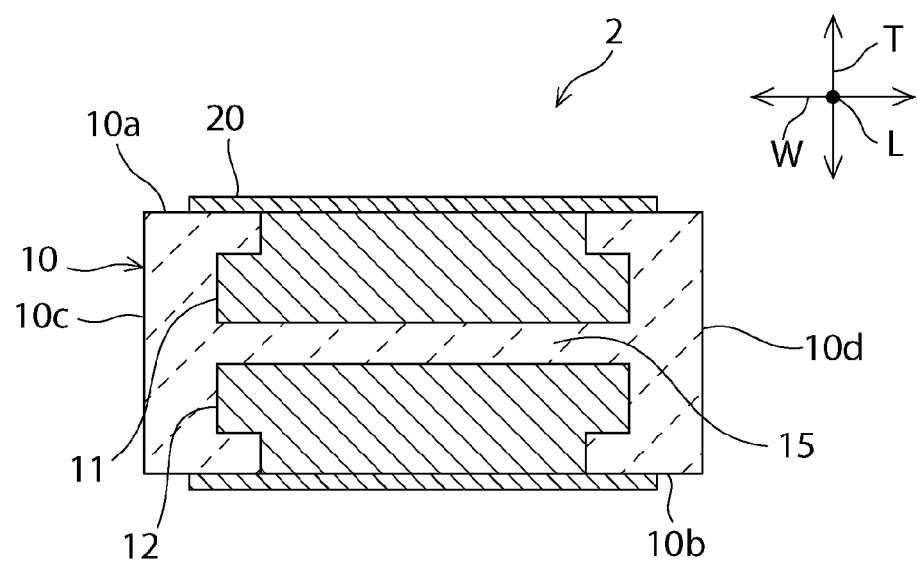
FIG. 11 is a schematic cross-sectional view taken along the line XI-XI in FIG. 8.
Figure 12:
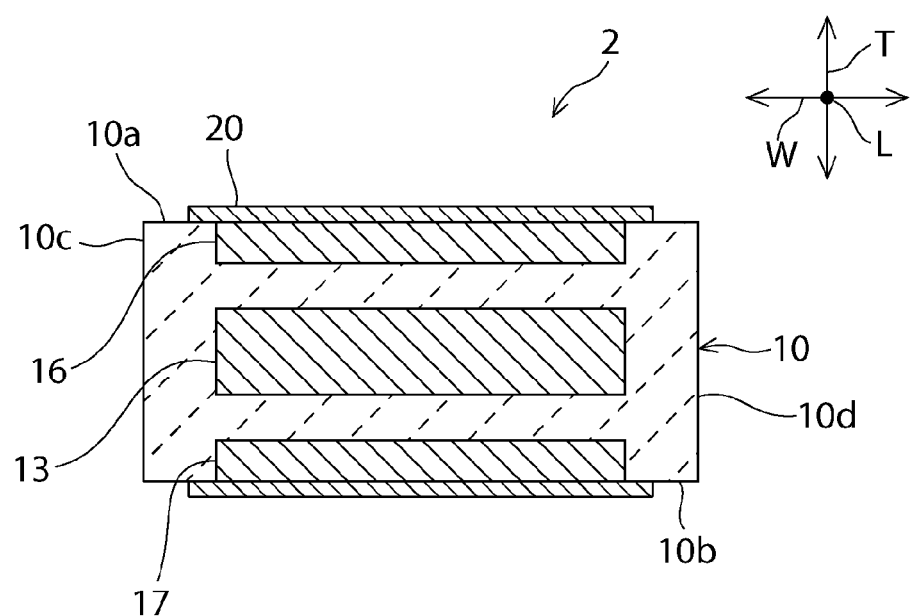
FIG. 12 is a schematic cross-sectional view taken along the line XII-XII in FIG. 8.

FIG. 8 is a schematic cross-sectional view of a ceramic electronic component according to a second preferred embodiment of the present invention. FIG. 9 is a schematic plan view of the ceramic electronic component according to the second preferred embodiment. FIG. 10 is a schematic back-side view of the ceramic electronic component according to the second preferred embodiment. FIG. 11 is a schematic cross-sectional view taken along the line XI-XI in FIG. 8. FIG. 12 is a schematic cross-sectional view taken along the line XII-XII in FIG. 8.

As illustrated in FIGS. 8 to 12, in a ceramic electronic component 2, the first inner electrodes 11 and the second inner electrodes 12 are aligned in the thickness direction T. The first auxiliary electrodes 16 and the second auxiliary electrodes 17 are aligned in the thickness direction T.

The ceramic electronic component 2 includes third inner electrodes 13. The third inner electrodes 13 do not extend to the surfaces of the ceramic element 10. The third inner electrodes 13 are positioned between the plurality of first inner electrodes 11 and the plurality of second inner electrodes 12 and face each of the first inner electrodes 11 and the second inner electrodes 12 in the thickness direction T. The third inner electrodes 13 and the first and second auxiliary electrodes 16 and 17 are aligned in the thickness direction T. The ceramic electronic component 2 can also provide substantially the same advantageous effects as in the ceramic electronic component 1.

Third Preferred Embodiment

Figure 13:
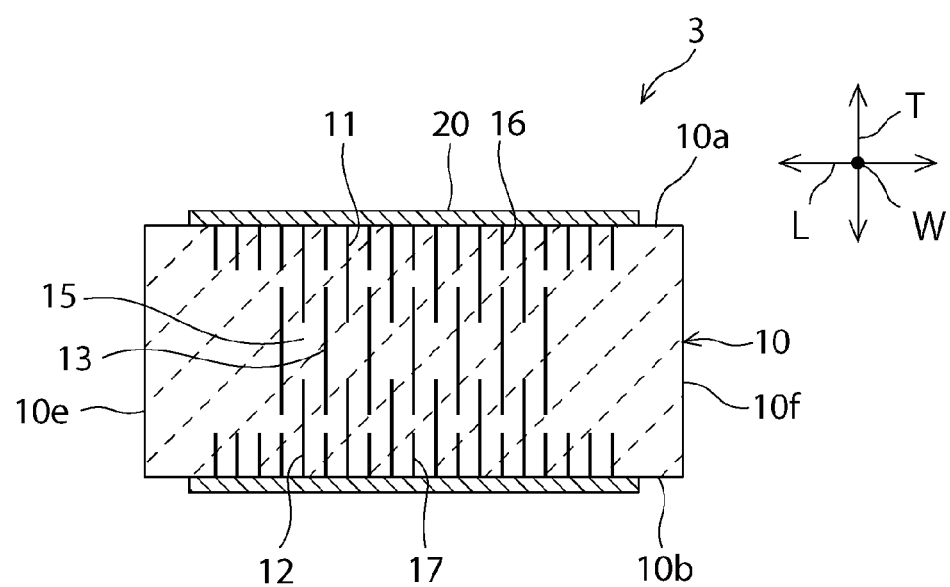
FIG. 13 is a schematic cross-sectional view of a ceramic electronic component according to a third preferred embodiment of the present invention.

FIG. 13 is a schematic cross-sectional view of a ceramic electronic component according to a third preferred embodiment of the present invention. As illustrated in FIG. 13, a ceramic electronic component 3 according to the third preferred embodiment includes the third inner electrodes 13, as in the ceramic electronic component 2 according to the second preferred embodiment. One or more of the first auxiliary electrodes 16 are positioned between the first inner electrode 11 nearest to the first end surface 10e of the ceramic element 10 and the first end surface 10e in the ceramic electronic component 3. Another one or more of the first auxiliary electrodes 16 are positioned between the first inner electrode 11 nearest to the second end surface 10f of the ceramic element 10 and the second end surface 10f. Thus, the adhesive strength between the outer electrode 20 and the ceramic element 10 is higher.

Fourth Preferred Embodiment

Figure 14:
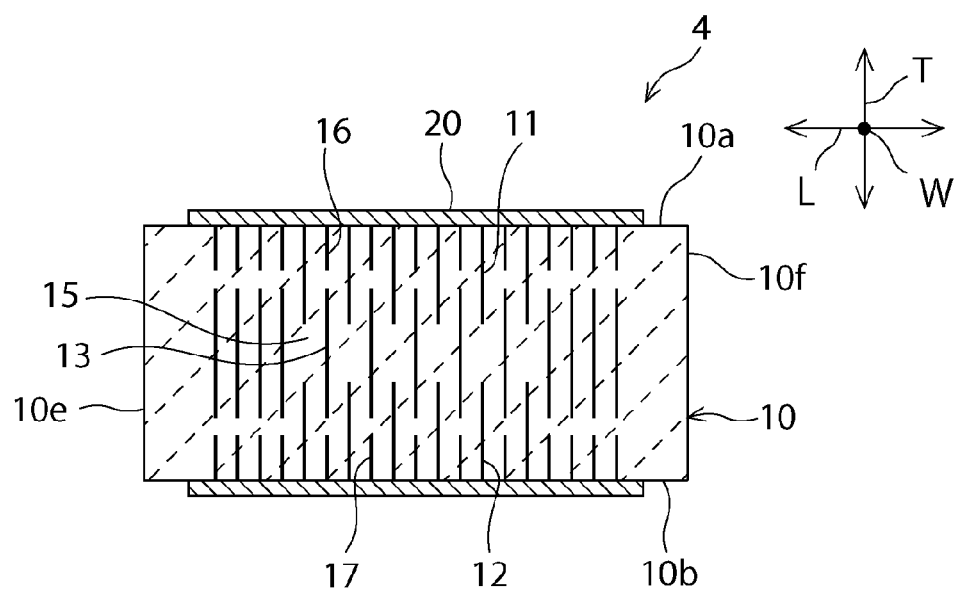
FIG. 14 is a schematic cross-sectional view of a ceramic electronic component according to a fourth preferred embodiment of the present invention.

FIG. 14 is a schematic cross-sectional view of a ceramic electronic component according to a fourth preferred embodiment of the present invention. As illustrated in illustrated in FIG. 14, a ceramic electronic component 4 according to the fourth preferred embodiment includes the third inner electrodes 13, as in the ceramic electronic component 2 according to the second preferred embodiment. One or more of the first auxiliary electrodes 16 are positioned between the first inner electrode 11 nearest to the first end surface 10e of the ceramic element 10 and the first end surface 10e in the ceramic electronic component 4, as in the ceramic electronic component 3 according to the third preferred embodiment. Another one or more of the first auxiliary electrodes 16 are positioned between the first inner electrode 11 nearest to the second end surface 10f of the ceramic element 10 and the second end surface 10f. In the ceramic electronic component 4, one or more of the third inner electrodes 13 are also positioned between the first inner electrode 11 nearest to the first end surface 10e of the ceramic element 10 and the first end surface 10e. Another one or more of the third inner electrodes 13 are also positioned between the first inner electrode 11 nearest to the second end surface 10f of the ceramic element 10 and the second end surface 10f. The ceramic electronic component 4 may be preferable in terms of its manufacturing cost because the arrangement of the inner electrodes can be made up of two kinds of patterns.

Fifth Preferred Embodiment

Figure 15:
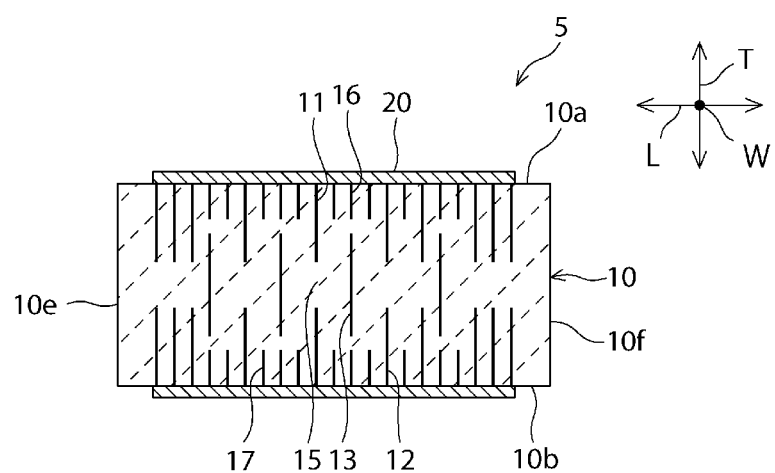
FIG. 15 is a schematic cross-sectional view of a ceramic electronic component according to a fifth preferred embodiment of the present invention.

FIG. 15 is a schematic cross-sectional view of a ceramic electronic component according to a fifth preferred embodiment of the present invention. As illustrated in FIG. 15, a ceramic electronic component 5 according to the fifth preferred embodiment includes the third inner electrodes 13, as in the ceramic electronic component 2 according to the second preferred embodiment. In the ceramic electronic component 5, the plurality of first auxiliary electrodes 16 are arranged between the first inner electrodes 11. Thus the probability that moisture from between the outer electrode 20 and the ceramic element 10 will reach an auxiliary electrode is higher than the probability that the moisture will reach an inner electrode. Accordingly, the ceramic electronic component 5 has a high resistance to moisture.

Sixth Preferred Embodiment

Figure 16:
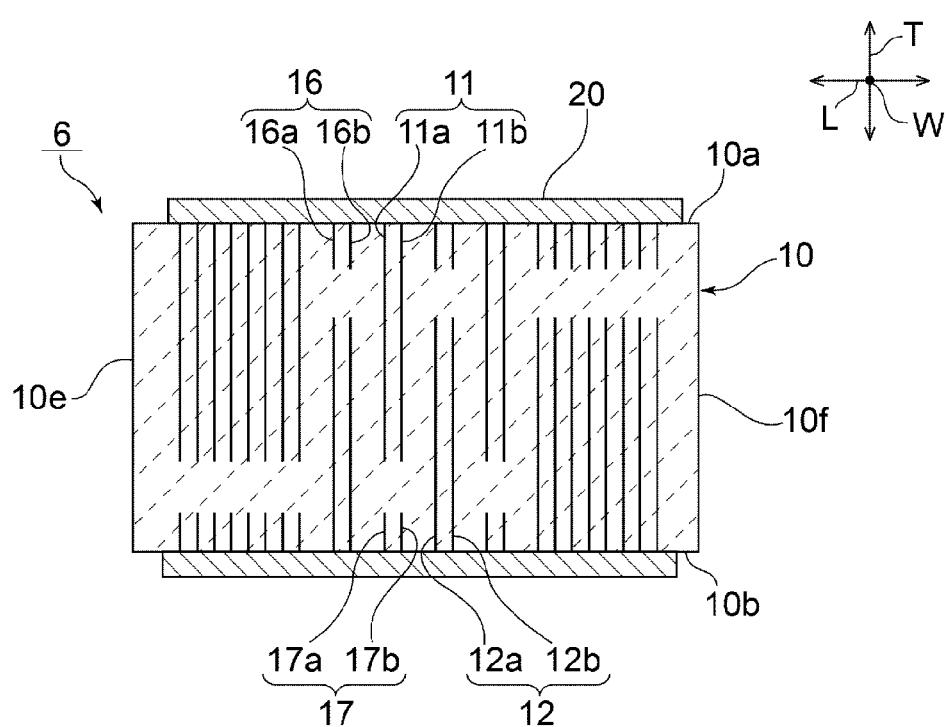
FIG. 16 is a schematic cross-sectional view of a ceramic electronic component according to a sixth preferred embodiment of the present invention.
Figure 17:
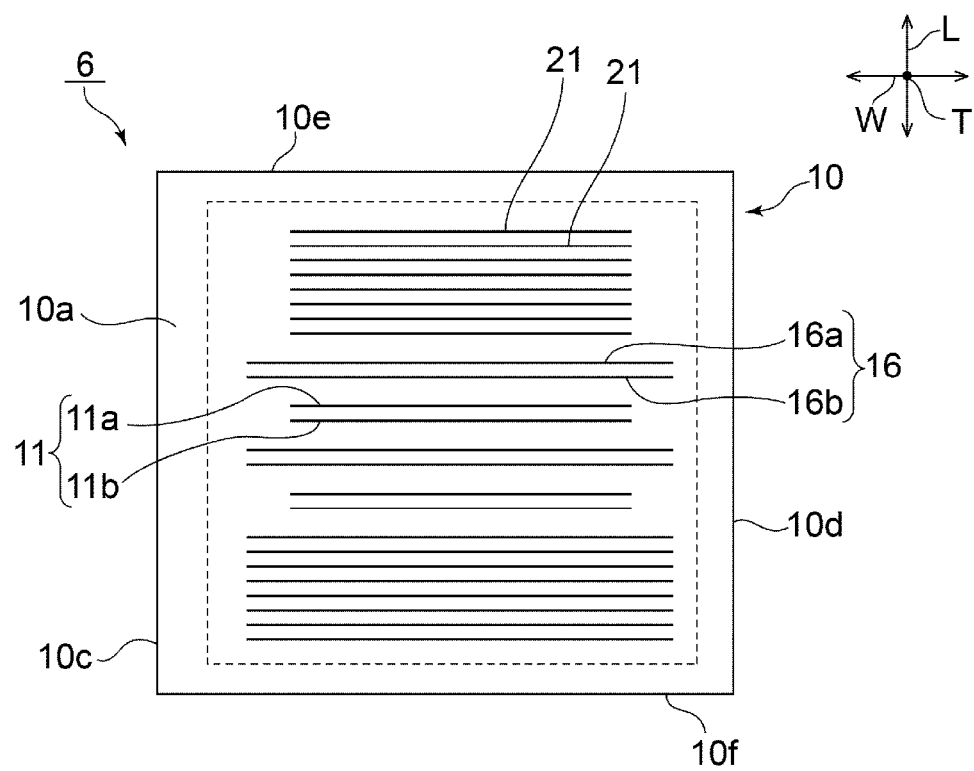
FIG. 17 is a schematic plan view of the ceramic electronic component according to the sixth preferred embodiment of the present invention.

FIGS. 16 and 17 are a schematic cross-sectional view and a schematic plan view, respectively, of a ceramic electronic component according to a sixth preferred embodiment of the present invention.

The first inner electrodes 11 and second inner electrodes 12 in the ceramic electronic component 6 according to the sixth preferred embodiment are arranged in the ceramic element 10 in substantially the same manner as in the first preferred embodiment. In the present preferred embodiment, each of the first inner electrodes 11 and second inner electrodes 12 is a split inner electrode. That is, the first inner electrode includes two electrode layers 11a and 11b connected to the same potential. The electrode layers 11a and 11b overlap each other such that a ceramic layer is disposed therebetween. The second inner electrode 12 includes two electrode layers 12a and 12b, as in the first inner electrode 11. As in this case, each of the first and second inner electrodes may be a split inner electrode.

The first and second auxiliary electrodes 16 and 17 are also disposed in the sixth preferred embodiment, as in the first preferred embodiment. Each of the first auxiliary electrodes 16 is a split electrode including two electrode layers 16a and 16b, and each of the second auxiliary electrodes 17 is a split electrode including two electrode layers 17a and 17b.

The description is provided below using the first auxiliary electrodes 16 with reference to FIG. 17. The first auxiliary electrodes 16 extend outward from the region where the first inner electrodes 11 are disposed in the width direction W. Accordingly, the resistance to moisture can be enhanced, as in the first preferred embodiment.

In the present preferred embodiment, as illustrated in FIG. 17, third auxiliary electrodes 21 are disposed in the ceramic element 10. The third auxiliary electrodes 21 are exposed to the region where the first inner electrodes 11 are disposed in the width direction W and do not reach the portion outside that region in the width direction W. As in this case, an auxiliary electrode such as the third auxiliary electrode 21 may be further included as another auxiliary electrode that does not reach the region where the inner electrodes are disposed in the present invention. The other respects of the sixth preferred embodiment are substantially the same as in the first preferred embodiment.

Seventh Preferred Embodiment

Figure 18:
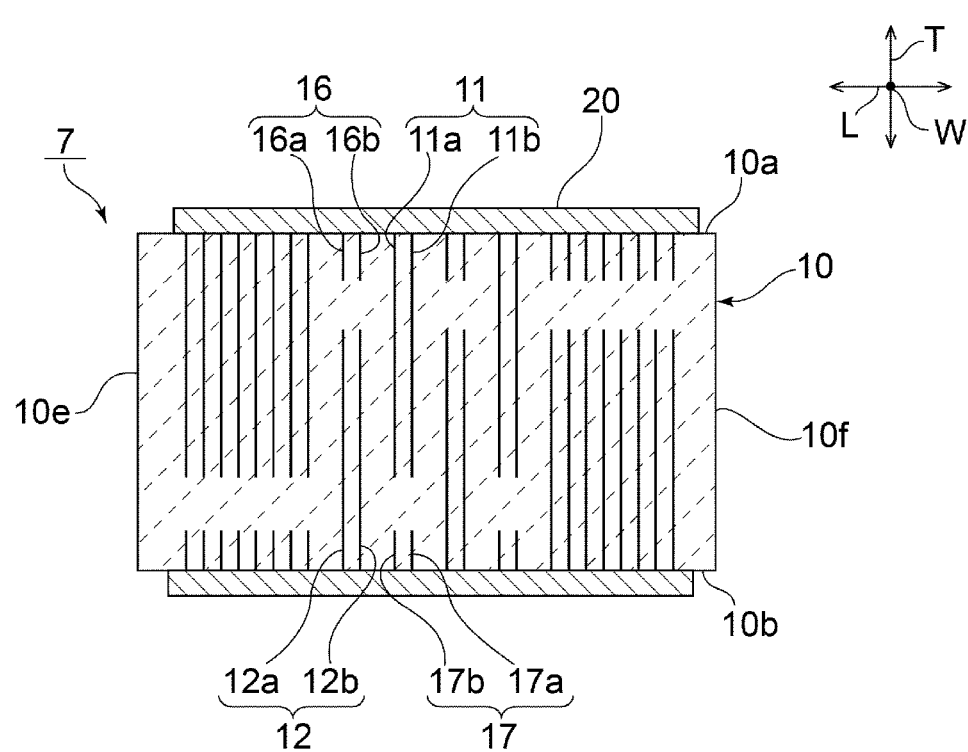
FIG. 18 is a schematic cross-sectional view of a ceramic electronic component according to a seventh preferred embodiment of the present invention.
Figure 19:
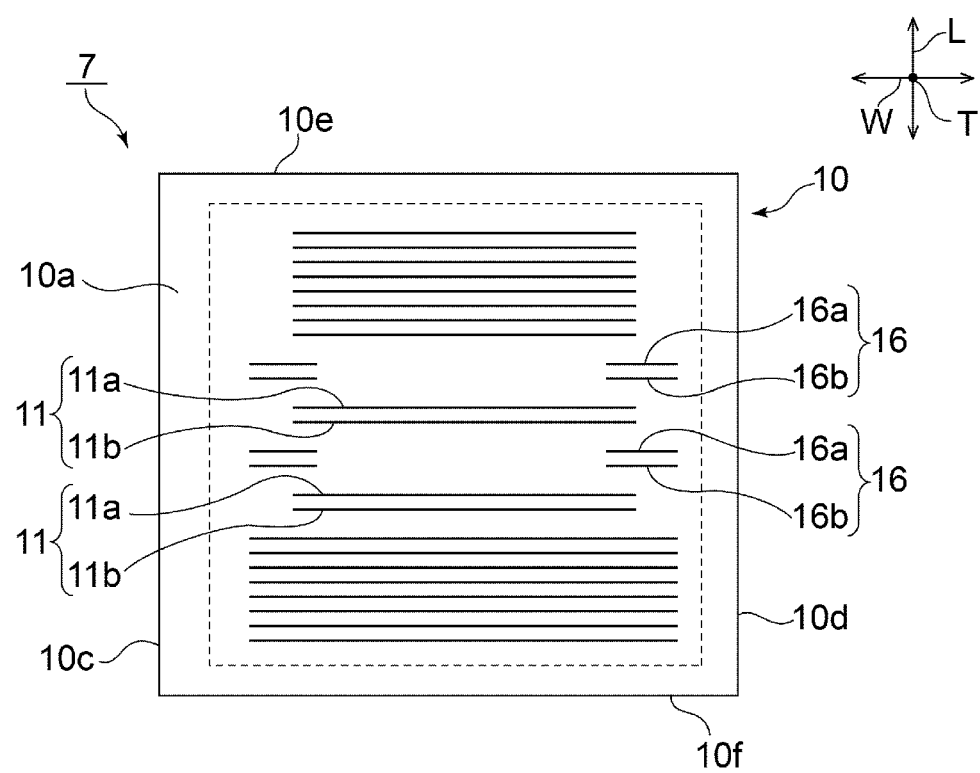
FIG. 19 is a schematic plan view of the ceramic electronic component according to the seventh preferred embodiment of the present invention.

FIGS. 18 and 19 are a schematic cross-sectional view and a schematic plan view of a ceramic electronic component 7 according to a seventh preferred embodiment, respectively. The ceramic electronic component 7 according to the present preferred embodiment is substantially the same as the sixth preferred embodiment, except for where the first and second auxiliary electrodes 16 and 17 are formed. The difference is that the first auxiliary electrodes 16 are positioned over the end portion of the region where the first inner electrodes 11 are disposed in the first principal surface 10a in the width direction W, as illustrated in FIG. 19. In other words, the first auxiliary electrodes 16 do not reach the central region of each of the first and second inner electrodes 11 and 12 in the width direction W.

Although not explicitly illustrated in FIG. 19, the second auxiliary electrodes 17 illustrated in FIG. 18 also do not reach the central region in the width direction W in the second principal surface 10b, to which the second inner electrodes 12 are exposed. As in this case, the first and second auxiliary electrodes 16 and 17 may be arranged only in the vicinity of the end portion where the first and second inner electrodes 11 and 12 are disposed so as to be positioned over that end portion in the present invention.

Eighth Preferred Embodiment

Figure 20:
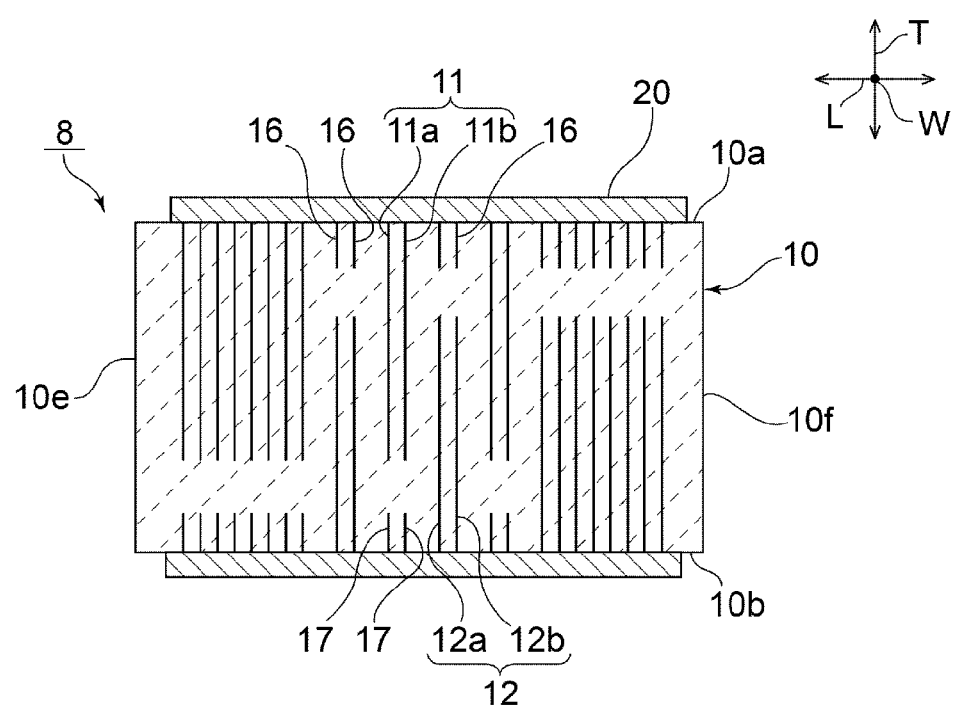
FIG. 20 is a schematic cross-sectional view of a ceramic electronic component according to an eighth preferred embodiment of the present invention.
Figure 21:
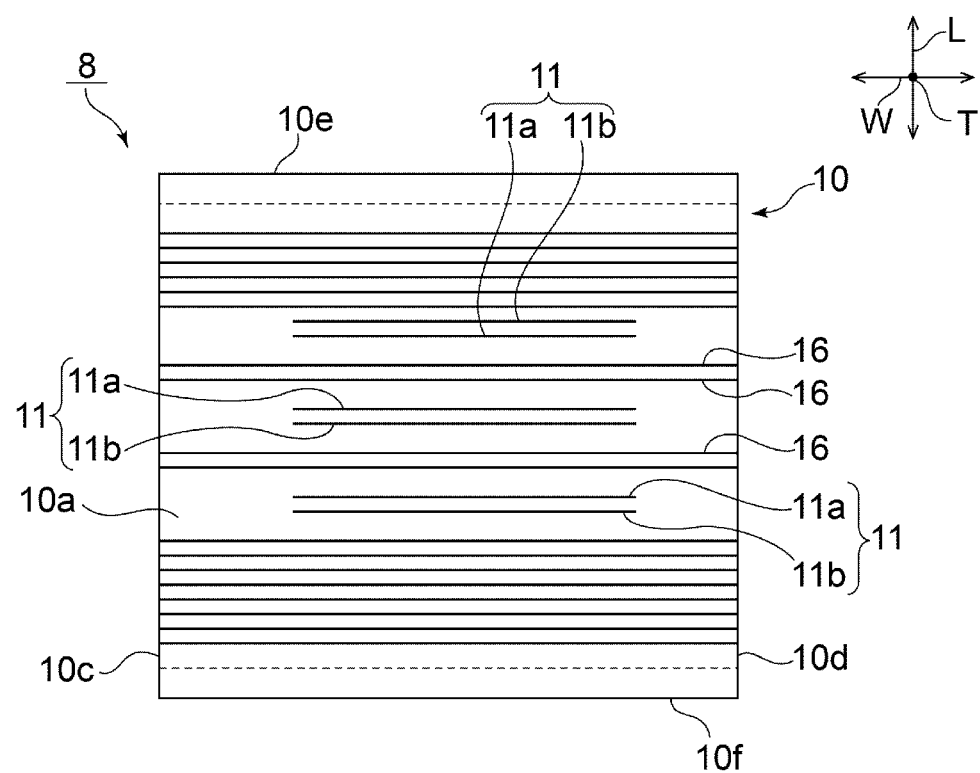
FIG. 21 is a schematic plan view of the ceramic electronic component according to the eighth preferred embodiment of the present invention.

FIGS. 20 and 21 are a schematic cross-sectional view and a schematic plan view, respectively, of a ceramic electronic component according to an eighth preferred embodiment of the present invention.

A ceramic electronic component 8 according to the eighth preferred embodiment is substantially the same as the sixth preferred embodiment, except for the first and second auxiliary electrodes 16 and 17. In the present preferred embodiment, as illustrated in FIG. 21, the first auxiliary electrodes 16 reach both ends in the width direction W in the first principal surface 10a. That is, the first auxiliary electrodes 16 reach both ends in the width direction W inside the ceramic element 10, in other words, both the first and second side surfaces 10c and 10d. The second auxiliary electrodes 17 are disposed in substantially the same manner.

Accordingly, the first and second auxiliary electrodes 16 and 17 are exposed to the first and second side surfaces 10c and 10d. Thus, it is desirable that the outer electrode 20 be formed so as to include a folded portion that reaches the first and second side surfaces 10c and 10d. Because the first and second auxiliary electrodes 16 and 17 are exposed to the first and second side surfaces 10c and 10d, the folded portion can be formed reliably. This can enable the path along which plating solution or moisture from the outside will reach the first and second inner electrodes 11 and 12 to be longer than that in each of the first preferred embodiment and sixth preferred embodiment. Accordingly, the resistance to moisture can be further enhanced, as described above.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ceramic electronic component comprising:
   a ceramic element including a first principal surface, a second principal surface opposite to the first principal surface, and a plurality of ceramic layers arranged in a stacking direction;
   at least one first inner electrode disposed inside the ceramic element and extending to the first principal surface of the ceramic element, but not extending to the second principal surface of the ceramic element that is opposed to the first principal surface;
   a second inner electrode disposed inside the ceramic element, facing the at least one first inner electrode, and extending to the second principal surface of the ceramic element;
   an outer electrode arranged on the first principal surface of the ceramic element, connected to the at least one first inner electrode, and including a plated film directly connected to the at least one inner electrode;
   a first auxiliary electrode disposed inside the ceramic element and extending to the first principal surface of the ceramic element; and
   a second auxiliary electrode disposed inside the ceramic element and extending to the second principal surface of the ceramic element; wherein
   the first and second auxiliary electrodes are respectively exposed at the first principal surface and the second principal surface of the ceramic element;
   the at least one first inner electrode extends along a first direction on the first principal surface;
   the first auxiliary electrode extends outward from a region where the at least one first inner electrode is disposed in the first direction on the first principal surface;
   a portion of the first auxiliary electrode that is exposed at the first principal surface extends farther outward in the first direction from a region where a portion of the second inner electrode that is exposed at the second principal surface is disposed;
   the second inner electrode is disposed on a same layer of the plurality of ceramic layers as the first auxiliary electrode;
   the first auxiliary electrode crosses a center point of the first principal surface in the first direction;
   the outer electrode covers the at least one first inner electrode and the first auxiliary electrode;
   each of the at least one first inner electrode and the second inner electrode is a split inner electrode;
   third auxiliary electrodes are arranged at an outermost portion of the ceramic element in the stacking direction;
   the third auxiliary electrodes extend to at least a center point of the ceramic element in a direction perpendicular to the first principal surface and the second principal surface of the ceramic element;
   the third auxiliary electrodes are exposed at the first principal surface of the ceramic element;
   the third auxiliary electrodes extend along the first direction on the first principal surface; and
   the portion of the first auxiliary electrode that is exposed at the first principal surface extends farther outward in the first direction from a region where a portion of the third auxiliary electrode that is exposed at the first principal surface is disposed.

2. The ceramic electronic component according to claim 1, wherein the first auxiliary electrode does not reach a central region of each of the at least one first inner electrode and the second inner electrode in a width direction of the ceramic element.

3. The ceramic electronic component according to claim 1, wherein the first auxiliary electrode is a single continuous auxiliary electrode.

4. A ceramic electronic apparatus comprising:
the ceramic electronic component according to claim 1;
a substrate arranged such that a principal surface of the substrate faces the second principal surface in the ceramic electronic component; and
at least one wire electrically connected to the outer electrode.

* * * * *